(12) United States Patent
Yamamoto

(10) Patent No.: US 9,624,569 B2
(45) Date of Patent: Apr. 18, 2017

(54) HARD COATING FILM AND METHOD FOR PRODUCING SAME

(71) Applicant: KOBE STEEL, LTD., Kobe-shi (JP)

(72) Inventor: Kenji Yamamoto, Hyogo (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 14/914,202

(22) PCT Filed: Aug. 13, 2014

(86) PCT No.: PCT/JP2014/071375
§ 371 (c)(1),
(2) Date: Feb. 24, 2016

(87) PCT Pub. No.: WO2015/037386
PCT Pub. Date: Mar. 19, 2015

(65) Prior Publication Data
US 2016/0208375 A1      Jul. 21, 2016

(30) Foreign Application Priority Data

Sep. 12, 2013   (JP) ................................. 2013-189626

(51) Int. Cl.
*C04B 35/00*   (2006.01)
*C23C 14/22*   (2006.01)
(Continued)

(52) U.S. Cl.
CPC ............ *C23C 14/22* (2013.01); *C04B 35/581* (2013.01); *C04B 35/58007* (2013.01);
(Continued)

(58) Field of Classification Search
CPC ........ C04B 35/58021; C04B 35/58014; C04B 35/581
(Continued)

(56) References Cited

U.S. PATENT DOCUMENTS 5,961,729 A * 10/1999 Akari .................... C23C 14/325
134/1
7,211,138 B2 * 5/2007 Yamamoto .............. C23C 14/06
106/286.2
(Continued)

FOREIGN PATENT DOCUMENTS

JP       2000-107909 A       4/2000
JP       2001-172763 A       6/2001
(Continued)

OTHER PUBLICATIONS

International Search Report issued on Sep. 11, 2014 in PCT/JP2014/071375 (with English language translation).
(Continued)

*Primary Examiner* — Noah Wiese
(74) *Attorney, Agent, or Firm* — Oblon, McClelland, Maier & Neustadt, L.L.P.

(57) ABSTRACT

A hard film whose composition formula satisfies $M_{1-a-b}C_aN_b$, in which M is at least one element selected from Ti, Cr and Al, or is the element and at least one element selected from Group 4 elements except for Ti, Group 5 elements, Group 6 elements except for Cr, Si, Y, and rare earth elements. Atomic ratios of M, C and N satisfy: $0.01 \leq a \leq 0.50$; $0.10 \leq b \leq 0.50$; and $0 < 1-a-b$. A ratio y of C-to-C bonding to all C bonding in the film is 0.20 or more.

13 Claims, 4 Drawing Sheets

(51) Int. Cl.
| | |
|---|---|
| C23C 14/00 | (2006.01) |
| C23C 14/06 | (2006.01) |
| C23C 14/32 | (2006.01) |
| H01J 37/32 | (2006.01) |
| C04B 35/58 | (2006.01) |
| C04B 35/581 | (2006.01) |

(52) U.S. Cl.
CPC .... *C04B 35/58021* (2013.01); *C23C 14/0021* (2013.01); *C23C 14/0664* (2013.01); *C23C 14/325* (2013.01); *H01J 37/32055* (2013.01); *H01J 37/32614* (2013.01); *H01J 37/32669* (2013.01)

(58) Field of Classification Search
USPC .............................................. 501/96.1, 98.4
See application file for complete search history.

(56) References Cited

U.S. PATENT DOCUMENTS

| | | | | |
|---|---|---|---|---|
| 8,298,999 | B2* | 10/2012 | Honda ................. | C10M 103/02 508/108 |
| 2002/0168552 | A1 | 11/2002 | Yamamoto et al. | |
| 2004/0237840 | A1 | 12/2004 | Yamamoto et al. | |
| 2005/0186448 | A1 | 8/2005 | Yamamoto et al. | |
| 2007/0284255 | A1* | 12/2007 | Gorokhovsky ......... | C22C 38/44 205/89 |
| 2009/0142509 | A1* | 6/2009 | Yamamoto ......... | C23C 14/0021 427/527 |
| 2010/0210489 | A1* | 8/2010 | Honda ................. | C10M 103/02 508/108 |

FOREIGN PATENT DOCUMENTS

| | | |
|---|---|---|
| JP | 2003-71610 A | 3/2003 |
| JP | 2009-05234 | 3/2009 |
| JP | 2009-052134 | 3/2009 |
| JP | 2009-155721 A | 7/2009 |
| JP | 2010-180479 | 8/2010 |

OTHER PUBLICATIONS

Written Opinion issued on Nov. 4, 2014 in PCT/JP2014/071375 (with English language translation).

Y.H. Cheng, et al., "Influence of CH$_4$ fraction on the composition, structure, and internal stress of the TiCN coatings deposited by LAFAD technique", Vacuum, vol. 85, 2010, pp. 89-94.

Wenran Feng, et al., "Titanium carbonitride films on cemented carbide cutting tool prepared by pulsed high energy density plasma" Applied Surface Science, vol. 253, 2007, pp. 4923-4927.

Yin-Yu Chang, et al., "Characterization of TiCr(C,N)/amorphous carbon coatings synthesized by a cathodic arc deposition process", Thin Solid Films, vol. 515, 2007, pp. 4722-4726.

Y.H. Lu, et al., "Effect of N content on phase configuration, nanostructure and mechanical behaviors in Ti-C$x$- N$y$ thin films", Applied Surface Science, vol. 255, 2009, pp. 7858-7863.

Koji Shimamura, et al., "High-efficiency and High-precision Machining of Difficult-to-machine Materials by PVD Coated Tools (1st Report)—Dry High-speed Milling of SUS304 with TiCN Coated End Mills Deposited by UBMS Method", Journal of the Japan society for Precision Engineering, vol. 76, No. 10, 2010, pp. 1182-1187, with English Abstract.

Y. H. Cheng, et al., "Internal stresses in TiN/Ti multilayer coatings deposited by large area filtered arc deposition" Journal of Applied Physics, vol. 104, 2008, pp. 093502-1-093502-7.

Jianyun Zheng, et al., "A thick TiN/TiCN multilayer film by DC magnetron sputtering", Surface & Coatings Technology, vol. 209, 2012, pp. 110-116.

D.V. Shtansky, et al. "Comparative investigation of TiAlC(N), TiCrAlC(N), and CrAlC(N) coatings deposited by sputtering of Max-phase Ti$_{2-x}$,Cr$_x$AlC targets", Surface & Coatings Technology, 203, (2009), 3595-3609.

D.V. Shtansky, et al. "Comparative investigation of TiAlC(N), TiCrAlC(N), and CrAlC(N) coatings deposited by sputtering of MAX-phase Ti$_{2-x}$Cr$_x$AlC targets", Surface & Coatings Technology, 203, (2009), 3595-3609.

* cited by examiner

HARD COATING FILM AND METHOD FOR PRODUCING SAME

TECHNICAL FIELD

The present invention relates to a hard film and a method for manufacturing the same. Particularly, the present invention relates to a hard film having excellent lubricity and wear resistance, and a method for manufacturing the same.

BACKGROUND ART

Previously, it has been performed that a hard film containing Ti or Al is coated on a surface of a tool, thereby improving wear resistance of the tool. For example, Patent Document 1 discloses a technique of forming a metal-containing hard film as the above-mentioned hard film in atmosphere gas comprising a carbon-containing gas and a rare gas as main components by an arc method. However, in the method of Patent Document 1, only hydrocarbon gas is used as reaction gas, and the metal-containing hard film formed is a carbide film containing only carbon as a non-metallic component. The carbide film shows a low friction coefficient, but has a defect of insufficient wear resistance.

On the other hand, a nitride film containing at least any one element of Ti, Cr and Al has a high hardness and also has excellent oxidation resistance, so that it has been coated on a surface of a cutting tool, a die or a machine component and has been used as a wear-resistant film. However, the above-mentioned nitride film has high friction coefficients with respect to various materials, so that it has a disadvantage of easy occurrence of baking in a sliding environment.

PRIOR ART DOCUMENTS

Patent Documents

Patent Document 1: JP-A-2001-172763

SUMMARY OF THE INVENTION

Problems That the Invention is to Solve

The present invention has been made by focusing on the situation as described above, and objects thereof are to realize a hard film showing excellent wear resistance and having a low friction coefficient to be less likely to cause baking in a sliding environment, and to establish a method for efficiently manufacturing the hard film. The above-mentioned property of "having a low friction coefficient to be less likely to cause baking in a sliding environment" is hereinafter sometimes referred to as "having excellent lubricity".

Means for Solving the Problems

The hard film having excellent lubricity and wear resistance, which could solve the above problems, is a hard film whose composition formula satisfies $M_{1-a-b}C_aN_b$, wherein the M is at least one element selected from the group consisting of Ti, Cr and Al, or the element and at least one element selected from the group consisting of Group 4 elements except for Ti, Group 5 elements, Group 6 elements except for Cr, Si, Y and rare earth elements, atomic ratios of M, C and N satisfy
$0.01 \leq a \leq 0.50$,
$0.10 \leq b \leq 0.50$ and
$0 < 1-a-b$, and a ratio y of C to C bonding to all C bonding in the film is 0.20 or more.

In the present invention, a method for manufacturing the hard film is included. The method includes performing arc discharge in an atmosphere gas comprising a hydrocarbon gas and a nitrogen gas by using an arc evaporation source which forms a magnetic field in which a magnetic field line is extending in a direction of a substrate almost orthogonally to an evaporation surface of a target, thereby forming the hard film.

It is preferred that an evaporation source in which a magnetic field is formed in a manner that an angle formed by a normal line of an evaporation surface of the target and the magnetic field line is ±30° or less is used as the arc evaporation source.

In addition, it is preferred that an evaporation source in which a unit of forming the magnetic field is arranged between an evaporation surface of the target and the substrate is used as the arc evaporation source.

As the preferable embodiment, the magnetic field is formed in a manner that a strength of the strongest magnetic field on an evaporation surface of the target is 20 gausses or more.

Advantageous Effects of the Invention

According to the present invention, a hard film having excellent wear resistance and also having excellent lubricity is obtained, because the hard film includes a carbonitride, and includes carbon not bonded to a metal element. Further, according to the manufacturing method in the present invention, the above-mentioned hard film can be efficiently manufactured. The hard film in the present invention can be used as a surface coating material of a cutting tool to be used for working such as milling, cutting and drilling, a plastic working tool such as die or a sliding component.

MODE FOR CARRYING OUT THE INVENTION

In order to solve the above-mentioned problems, the present inventors have made intensive studies. As a result, it has been found that excellent wear resistance and excellent lubricity are compatible with each other, when carbons are added to a nitride film which would be capable of securing wear resistance to form a carbonitride film having a composition formula indicated by the following formula (1) and for the existence form of carbons in the film, that is, the bonding state of carbons, at least a predetermined amount of bonds between carbons are contained. The hard film in the present invention will be described below first from the existence form of carbons in the film. The reason for determining the composition of the hard film in the present invention will be described later.

$$M_{1-a-b}C_aN_b \quad (1)$$

When C, that is, carbon, is contained in the hard film, C is usually bonded to a metal element. Accordingly, when the bonding state of C is measured by XPS, only a bond between the metal element and carbon is observed. However, in the present invention, it has been found that when a part of carbons in the hard film are not bonded to metal elements and the carbons are bonded to each other, that is, C is allowed to be present which does not constitute a carbide with a metal element and is bonded to carbon, lubricity is particularly improved. The above-mentioned "bond between carbons" in the present invention means a single bond between carbon and carbon, that is, a single bond, and is hereinafter sometimes referred to as a "C—C bond". Further, C constituting the above-mentioned C—C bond is hereinafter sometimes referred to as "free C".

Figure 1:
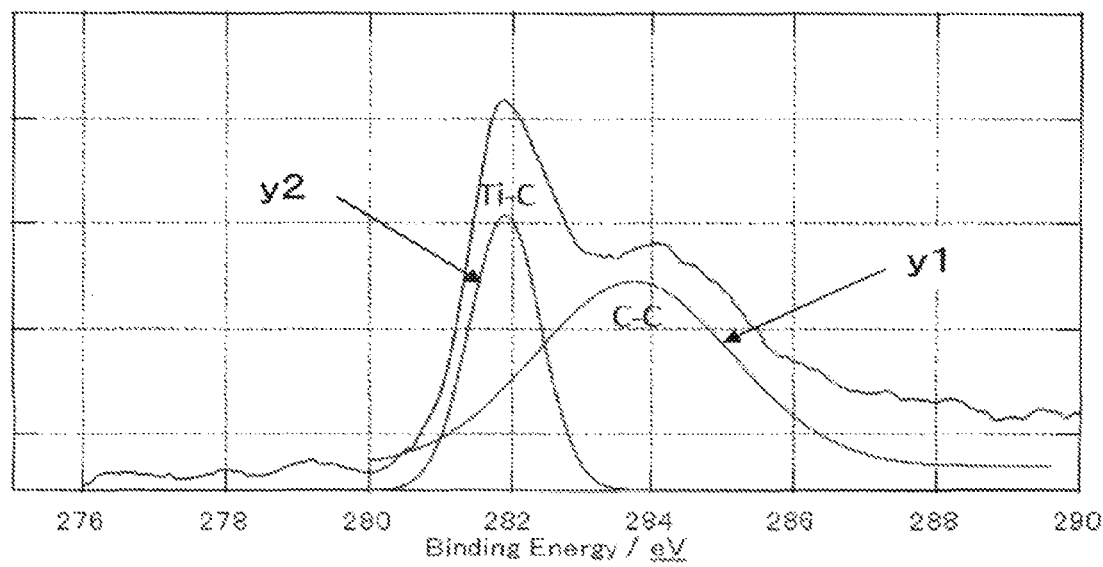
FIG. 1 is a graph showing an example of XPS (X-ray Photoelectron Spectroscopy, also referred to as Electron Spectroscopy for Chemical Analysis, ESCA) measurement results which are used for calculation of the ratio y of C to C bonding as specified in the present invention.

In the present invention, in order to surely enhance lubricity, for example, in order to achieve a low friction coefficient μ of 0.50 or less, preferably 0.30 or less, in examples described later, the ratio y of C to C bonding is required to be 0.20 or more. The ratio y of C to C bonding is hereinafter sometimes referred to as the C—C bonding ratio y. This C—C bonding ratio y is an index for quantitatively evaluating C—C bonds which are present in the hard film. A method for obtaining this C—C bonding ratio y is illustrated with reference to FIG. 1 as an example. That is, as exemplified in FIG. 1, a chemical bond state of C in the hard film is measured by XPS, and the peak area y1 derived from the C—C bond and the peak area y2 derived from the bond between the metal element (Ti in the above-mentioned FIG. 1) and carbon are determined. Then, the above-mentioned C—C bonding ratio y is determined as the ratio (y1/(y1+y2)) of the peak area y1 derived from the C—C bond to the sum of y1 and y2, that is, all bonds involving a carbon.

The above-mentioned C—C bonding ratio y is preferably 0.3 or more, more preferably 0.5 or more, and still more preferably 0.6 or more. Lubricity is enhanced with an increase in the above-mentioned ratio y. This is therefore preferred. However, when all bonds involving a carbon in the film are the C—C bonds, no metal-C bonds are present, which tends to cause a decrease in hardness. Accordingly, the upper limit of the above-mentioned ratio y is preferably 0.95 or less, and more preferably 0.90 or less.

Further, in order to exhibit the operation and effect due to the above-mentioned C, particularly the C—C bond, it is necessary that the atomic ratio of C to the all elements constituting the film, that is, a in the above-mentioned formula (1), is 0.01 or more. The above-mentioned atomic ratio of C is hereinafter sometimes referred to as the "C amount a". The above-mentioned C amount a is preferably 0.10 or more, and more preferably 0.20 or more. On the other hand, when the above-mentioned C amount a is too high, a nitride component decreases to conversely cause a decrease in hardness. Accordingly, the upper limit of the C amount a is 0.50 or less. The C amount a is preferably 0.40 or less, and more preferably 0.30 or less.

The atomic ratio of N, that is, b in the above-mentioned formula (1), is $0.10 \leq b \leq 0.50$. The above-mentioned atomic ratio of N is hereinafter sometimes referred to as the "N amount b". In order to enhance wear resistance, it is desirable that a metal nitride is contained in the film. Preferably, it is desirable that a crystalline metal nitride in which a peak can be confirmed by X-ray diffraction, electron beam diffraction or the like is contained. From the viewpoint of securing wear resistance as described above, the N amount b is 0.10 or more as described above. The N amount b is preferably 0.20 or more, and more preferably 0.25 or more. On the other hand, when the N amount b increases, the friction coefficient is liable to increase. Accordingly, the N amount b is 0.50 or less. The N amount b is preferably 0.45 or less, and more preferably 0.40 or less.

The M in the above-mentioned formula (1) is at least one element selected from the group consisting of Ti, Cr and Al, or the above-mentioned element and at least one element selected from the group consisting of the group 4 elements except for Ti, the group 5 elements, the group 6 elements except for Cr, Si, Y and rare earth elements. In the present invention, the above-mentioned rare earth elements mean lanthanoid elements, that is, 15 elements from La to Lu, and scandium. The above-mentioned group 4 elements, group 5 elements and group 6 elements mean the element groups of the above-mentioned respective groups shown in the periodic table, respectively.

The atomic ratio of M, that is, 1-a-b in the above-mentioned formula (1), may be more than 0. The above-mentioned 1-a-b can be, for example, 0.10 or more, and further, 0.20 or more. Furthermore, the upper limit of the above-mentioned 1-a-b can be, for example, 0.60 or less, and further, 0.50 or less.

When the above-mentioned M is at least one element selected from the group consisting of Ti, Cr and Al and at least one element selected from the group consisting of the group 4 elements except for Ti, the group 5 elements, the group 6 elements except for Cr, Si, Y and rare earth elements, the atomic ratio of the at least one element selected from the group consisting of Ti, Cr and Al to M is preferably 0.50 or more, more preferably 0.70 or more, and still more preferably 0.80 or more, in total.

The thickness of the hard film in the present invention is not particularly limited. In order to sufficiently exhibit wear resistance and lubricity, it is preferably 0.5 μm or more, and more preferably 1 μm or more. On the other hand, when the thickness is too thick, damage or separation of the film becomes liable to occur during cutting. Accordingly, the above-mentioned thickness is preferably 50 μm or less, and more preferably 30 μm or less.

Method for Manufacturing Hard Film in the Present Invention

As described above, in order to form the hard film in the present invention containing at least a predetermined amount of the C—C bonds, it is effective to form the film by a method defined in the present invention. That is, using an arc evaporation source which forms a magnetic field in which magnetic field line is extending in a direction of a substrate almost orthogonally to an evaporation surface of a target, the hard film is formed by performing arc discharge in an atmosphere gas comprising a hydrocarbon gas and a nitrogen gas. At this time, in an arc ion plating (AIP, Arc Ion Plating) apparatus, preferably, it is quite effective for forming the hard film in the present invention to arrange a magnet as a magnetic field forming unit in front of the evaporation surface of the target, that is, on the substrate side, and to extend the magnetic field lines forward almost orthogonally to the evaporation surface of the target, that is, toward the substrate direction.

Figure 4:
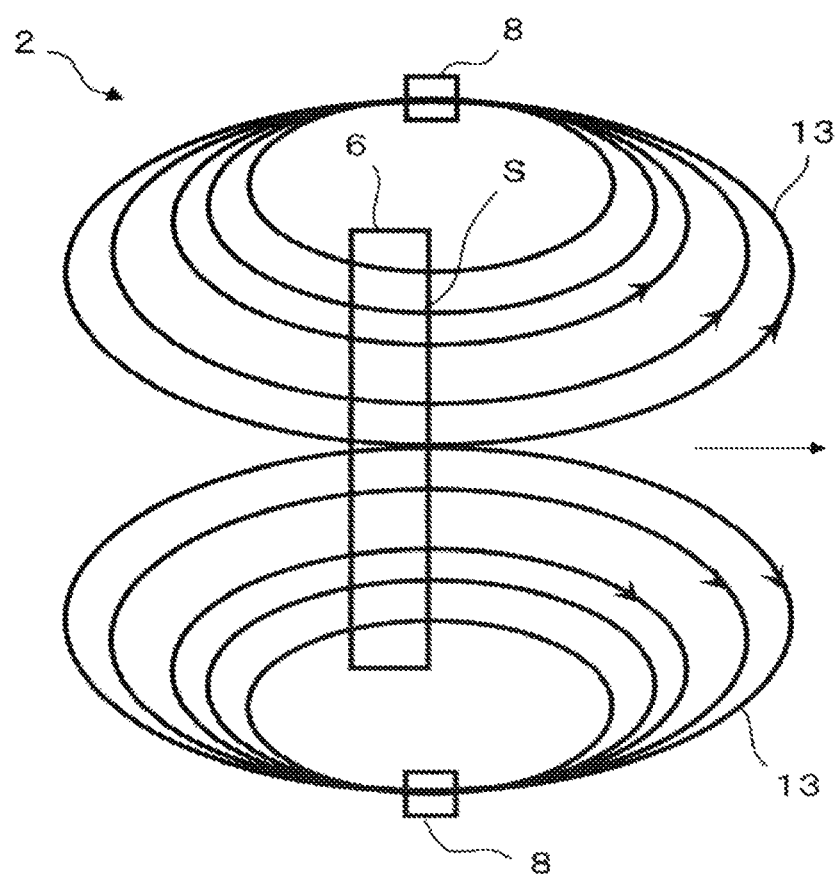
FIG. 4 is a view schematically showing magnetic field lines formed in the case of using an arc evaporation source subjected to the practice of the present invention.
Figure 5:
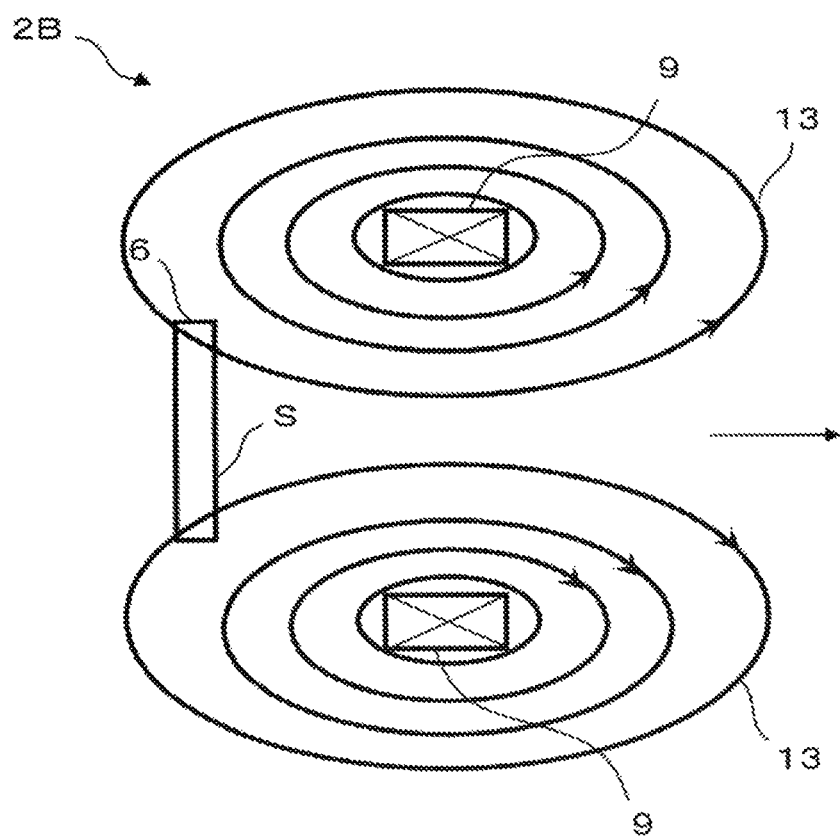
FIG. 5 is a view schematically showing magnetic field lines formed in the case of using another arc evaporation source subjected to the practice of the present invention. Incidentally, the scale of FIG. 5 is ½ that of the above-mentioned case of FIG. 3 or FIG. 4.

By forming a state where the magnetic field lines are extending forward as described above, electrons emitted from the target as a cathode are restrained by the magnetic field lines and move, and become liable to repeat collision with the hydrocarbon gas such as methane or acetylene in the atmosphere and decomposition thereof, resulting in easy formation of free C. Particularly, this tendency becomes remarkable by using an arc evaporation source exemplified in FIG. 4 or FIG. 5 described later, particularly an arc evaporation source of a type in which magnetic field forming units are arranged between an evaporation surface S of a target and a substrate not shown in FIG. 5, as shown in FIG. 5. The strength of the magnetic field necessary for restraining the above-mentioned electrons is preferably 20 gausses or more, more preferably 50 gausses or more, and still more preferably 70 gausses or more, at a point where the magnetic field is strongest on the target evaporation surface. When the voltage is excessively increased for strengthening the magnetic field, discharge may be difficult, or bias of plasma can occur. Accordingly, the upper limit of the above-mentioned magnetic field strength is about 1000 gausses or less at a point where the magnetic field is strongest on the target evaporation surface.

Figure 2:
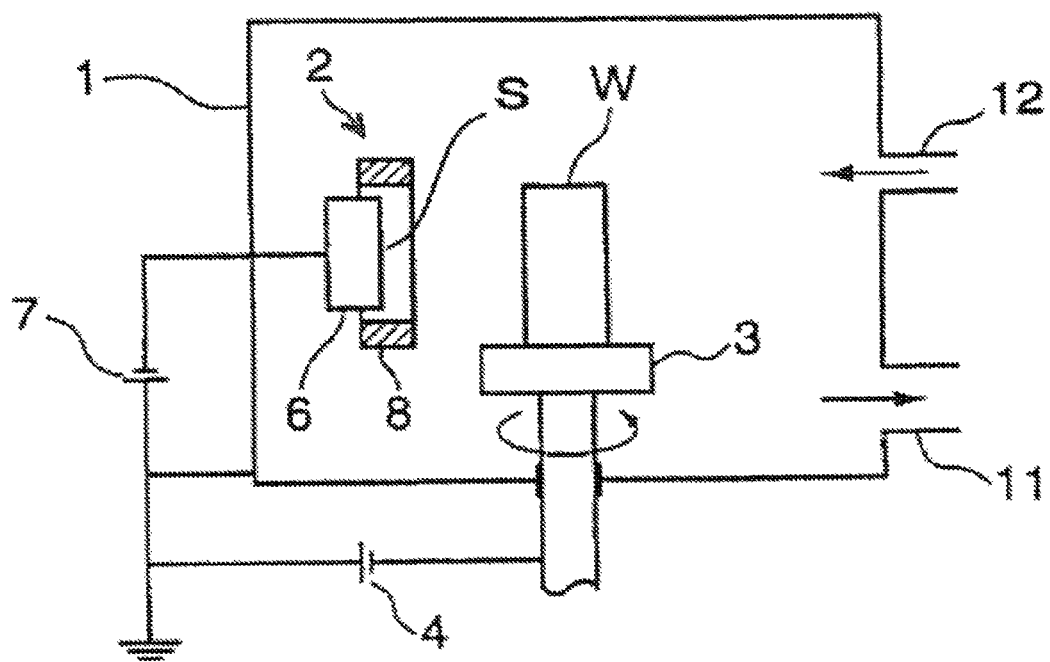
FIG. 2 is a schematic view showing an arc ion plating apparatus to be used in the practice of the present invention.

An example of an apparatus for carrying out the present invention will be briefly illustrated by showing an AIP apparatus in FIG. 2.

This AIP apparatus includes a vacuum chamber 1 including an exhaust port 11 for vacuum exhaust and a gas supply port 12 for supplying film forming gas, an arc evaporation source 2 in which a target constituting a cathode is evaporated by arc discharge to be ionized, a substrate table 3 for supporting a substrate W to be coated, and a bias power supply 4 for applying negative bias voltage to the substrate W through the substrate table 3, between the substrate table 3 and the above-mentioned vacuum chamber 1. The above-mentioned substrate W is also referred to as a base plate, a body to be treated or a cutting tool.

The above-mentioned arc evaporation source 2 includes a target 6 constituting a cathode, an arc power supply 7 connected between the target 6 and the vacuum chamber 1 constituting an anode, and magnets as magnetic field forming units of forming magnetic field lines which extend to a vicinity of the above-mentioned substrate W, forward almost orthogonally to an evaporation surface S of the target 6, that is, extending or parallel in a direction of the above-mentioned substrate, i.e. permanent magnets 8 in the case of FIG. 2. The term "almost orthogonally to an evaporation surface of the target" means that the magnetic field is formed in such a manner that angles formed by a normal line of the evaporation surface of the above-mentioned target and the above-mentioned magnetic field lines are ±30° or less.

The permanent magnets 8 as the magnetic field forming unit in the above-mentioned FIG. 2 are arranged so as to surround the evaporation surface S of the target 6. The magnetic field forming unit may be not only the above-mentioned permanent magnets, but also electromagnets including a coil and a coil power supply. As schematically shown in FIG. 4 or FIG. 5 described later, it is preferred that the magnetic field lines 13 surround a front of the evaporation surface S of the target 6, that is, a region in the substrate direction indicated by a straight arrow in a right direction in FIG. 4 or FIG. 5, and extend up to the substrate. For that purpose, it is preferred that the magnets such as the permanent magnets 8 or the electromagnets 9 are arranged so that a straight line connecting respective centers of two squares showing the permanent magnets 8 in FIG. 4 or the electromagnets 9 in FIG. 5, which are described later, is located at almost the same position as the evaporation surface S of the target, or between the evaporation surface S of the target and the substrate, that is, on the substrate side from the evaporation surface S of the target. More preferably, as shown in FIG. 5 described later, it is preferred that the above-mentioned magnets are arranged between the evaporation surface S of the target and the substrate.

Further, when performing film formation, arc evaporation sources of different forms may be installed in the same chamber. Furthermore, it is also possible to provide a sputter evaporation source together. For example, it is possible to install a plurality of the above-mentioned evaporation sources different in magnetic field line form or magnetic field strength in the same chamber and to perform film formation.

The atmosphere gas in the present invention is composed of reaction gas such as nitrogen gas or carbon-containing gas and assist gas used as needed, such as argon gas used for discharge stabilization. As the above-mentioned carbon-containing gas, examples thereof include saturated hydrocarbons such as methane, ethane, propane and butane, unsaturated hydrocarbons such as ethylene, acetylene, propylene and butylene, aromatic hydrocarbons such as benzene, alcohols such as methanol, ethanol, and the like. Further, a metal target to be used in the present invention can be used without any problem, as long as it is a target generally used in arc ion plating, and an alloy target can also be used.

The partial pressure of the above-mentioned carbon-containing gas depends on the C amount of the film to be formed, and is approximately from 0.01 to 1 Pa. Further, the partial pressure of the nitrogen gas is approximately from 0.3 to several Pa.

The substrate temperature during the film formation is preferably 200° C. or higher, from the viewpoint of reducing film stress. On the other hand, when the substrate temperature is too high, the substrate is deformed in some cases, depending on the kind of substrate. It is therefore recommended to adjust the substrate temperature to 600° C. or lower. When the iron substrate is hot work tool steel such as HSS (High-Speed Steel, such as high-speed tool steel or SKH51 of the JIS standard), SKD11 of the JIS standard or SKD61 of the JIS standard, it is preferred to adjust the substrate temperature during the film formation to a temperature equal to or lower than the tempering temperature of a material constituting the substrate, thereby maintaining mechanical properties of the substrate. The tempering temperature is, for example, approximately from 550 to 570° C. for the above-mentioned SKH51, from 550 to 680° C. for the above-mentioned SKD61, and from 500 to 530° C. in high-temperature tempering of above-mentioned SKD11. More preferably, the substrate temperature is adjusted to a temperature about 50° C. lower than each tempering temperature.

The bias voltage applied to the substrate can be within a range of 30 V to 500 V. The bias voltage is preferably 70 V or more, and more preferably 100 V or more. On the other hand, from the viewpoint of enhancing the film forming speed, the bias voltage is preferably 500 V or less, more preferably 400 V or less, still more preferably 300 V or less, yet still more preferably 260 V or less, and most preferably 200 V or less. The potential of bias is applied so as to become minus with respect to the earth potential, and for example, a bias potential of 100 V indicates that the bias potential is −100 V with respect to the earth potential.

This application claims the benefit of the priority based on Japanese Patent Application No. 2013-189626 filed on Sep. 12, 2013. The entire contents of Japanese Patent Application No. 2013-189626 filed on Sep. 12, 2013 are incorporated herein by reference.

EXAMPLES

The present invention is more specifically described below with reference to examples, but of course, the present invention should not be construed as being limited by the following examples. It is also possible to carry out the present invention with proper changes within the range that can comply with the spirit described above and later, and all of those are included within the technical scope of the present invention.

Example 1

Figure 3:
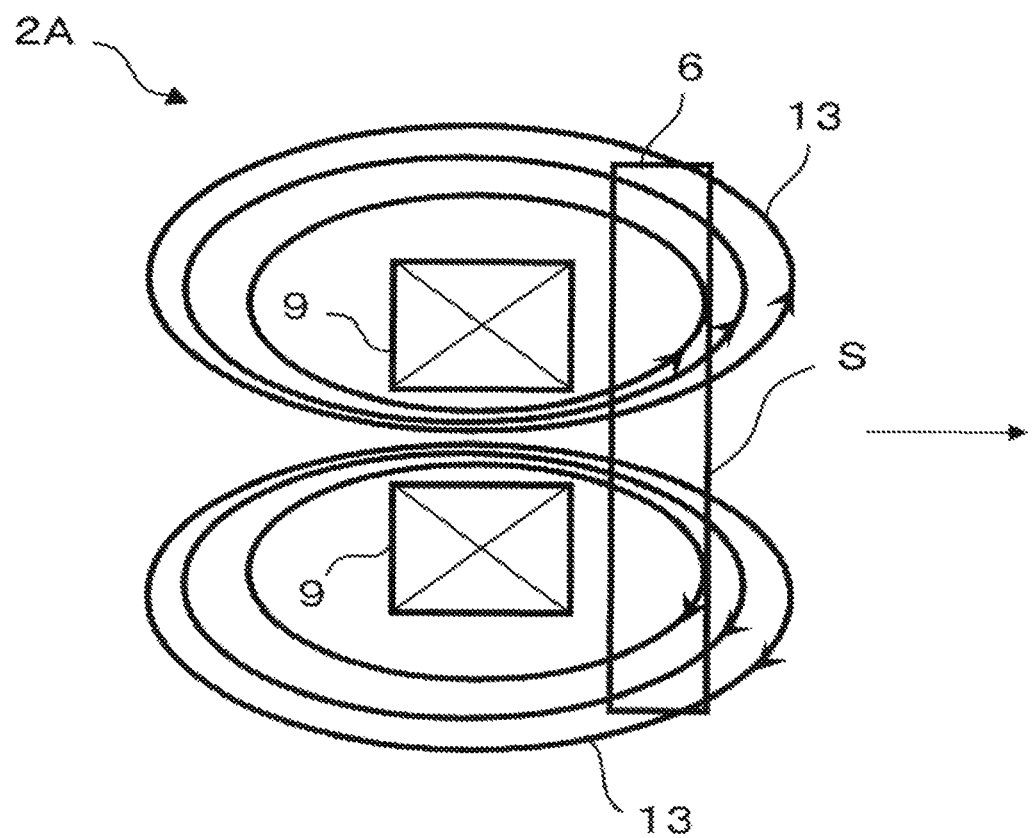
FIG. 3 is a view schematically showing magnetic field lines formed in the case of using a conventional arc evaporation source.

Films were formed by using an apparatus which is shown in FIG. 2 and includes an arc evaporation source having the magnetic field forming unit of forming magnetic field lines schematically shown in FIG. 3, 4 or 5. In the above-mentioned FIGS. 3 to 5, the straight arrow in the right direction indicates the substrate direction. Using Ti as a target, arc discharge was performed in the atmosphere gas of $N_2+C_2H_2+Ar$ used for discharge stabilization, under the following conditions. Further, in the formation of the above-mentioned films, Ti(CN) films each having a different C amount a and C—C bonding ratio y and all having a thickness of 3000 nm were each formed on a mirrored cemented carbide substrate by changing the $C_2H_2$ partial pressure as shown in Table 1. The strength of a strongest magnetic field on a target evaporation surface, that is, a magnetic field at the center part of the target, was about 10 gausses when the conventional type arc evaporation source 2A shown in FIG. 3 was used as the evaporation source, about 70 gausses when the recommended type arc evaporation source 2 shown in FIG. 4 was used as the evaporation source, and about 90 gausses when the other recommended type arc evaporation source 2B shown in FIG. 5 was used as the evaporation source, as shown in Table 1. Further, when the arc evaporation source 2A of the above-mentioned FIG. 3 was used, angles formed by a normal line of the evaporation surface of the above-mentioned target and the magnetic field lines exceeded ±30°. When the arc evaporation source 2 in the above-mentioned FIG. 4 and the arc evaporation source 2A in the above-mentioned FIG. 5 were used, angles formed by a normal line of the evaporation surface of the above-mentioned target and the magnetic field lines were ±30° or less.

Film Forming Conditions
Arc current: 100 A
Substrate temperature: 500° C.
Substrate bias: 100 V
$N_2$ partial pressure: 0.4 Pa, however, the case of No. 18 in Table 1 was 0 Pa.
Ar partial pressure: 1 Pa Using the films obtained, the film composition (C, N) and the peak area y1 of the C—C bond and the peak area y2 of the Ti—C bond in the bonding state of C were determined by XPS as exemplified in the above-mentioned FIG. 1. As the respective peak areas, the peaks approximated by Gaussian approximation, that is, the areas of y1 and y2 shown in the above-mentioned FIG. 1, were determined. Then, the C—C bonding ratio y was determined from the following formula (2). These results are shown in Table 1.

$$y=y1(y1+y2) \qquad (2)$$

In the formula (2), y indicates the C—C bonding ratio, y1 indicates the peak area of the C—C bond, and y2 indicates the peak area derived from the bond between the metal element and carbon, i.e. the Ti—C bond in this example.

Further, in order to evaluate lubricity and wear resistance as sliding properties, a reciprocating sliding test of a ball-on-plate type was performed under the following conditions. Then, the friction coefficient for lubricity evaluation was measured. The friction coefficient is an average value of 100 to 200 m, and indicated as "μ" in Table 1. Furthermore, the wear amount for wear resistance evaluation, specifically the wear cross-sectional area of slide marks, was measured. These results are shown in Table 1.

Test Conditions
Ball: SUJ2, 10 mm in diameter
Plate: Mirror-finished cemented carbide
Sliding amplitude: 10 mm
Vertical load: 2 N
Sliding speed: 0.1 m/sec
Sliding distance: 250 m
Lubrication: Not used, dry

TABLE 1

| No. | Evaporation Source | Strength of Magnetic Field [G] | $N_2$ Partial Pressure [Pa] | $C_2H_2$ Partial Pressure [Pa] | C Amount (a) | N Amount (b) | M Amount (1 − a − b) | C—C Bonding Ratio (y) | Friction Coefficient (μ) | Wear Amount (μm²) |
|---|---|---|---|---|---|---|---|---|---|---|
| 1 | FIG. 3 | 10 | 0.4 | 0 | 0.00 | 0.50 | 0.50 | 0.00 | 0.70 | 65 |
| 2 | FIG. 3 | 10 | 0.4 | 0.10 | 0.20 | 0.30 | 0.50 | 0.00 | 0.70 | 80 |
| 3 | FIG. 3 | 10 | 0.4 | 0.20 | 0.30 | 0.25 | 0.45 | 0.00 | 0.60 | 75 |
| 4 | FIG. 3 | 10 | 0.4 | 0.40 | 0.50 | 0.10 | 0.40 | 0.00 | 0.60 | 80 |
| 5 | FIG. 3 | 10 | 0.4 | 0.50 | 0.60 | 0.10 | 0.30 | 0.10 | 0.60 | 85 |
| 6 | FIG. 4 | 70 | 0.4 | 0.05 | 0.05 | 0.45 | 0.50 | 0.50 | 0.30 | 50 |
| 7 | FIG. 4 | 70 | 0.4 | 0.07 | 0.10 | 0.40 | 0.50 | 0.30 | 0.30 | 45 |
| 8 | FIG. 4 | 70 | 0.4 | 0.10 | 0.20 | 0.30 | 0.50 | 0.30 | 0.30 | 40 |
| 9 | FIG. 4 | 70 | 0.4 | 0.20 | 0.30 | 0.25 | 0.45 | 0.20 | 0.20 | 35 |
| 10 | FIG. 4 | 70 | 0.4 | 0.40 | 0.50 | 0.25 | 0.25 | 0.30 | 0.20 | 30 |
| 11 | FIG. 5 | 90 | 0.4 | 0 | 0.00 | 0.50 | 0.50 | 0.80 | 0.70 | 80 |
| 12 | FIG. 5 | 90 | 0.4 | 0.01 | 0.01 | 0.49 | 0.50 | 0.70 | 0.30 | 50 |
| 13 | FIG. 5 | 90 | 0.4 | 0.05 | 0.20 | 0.40 | 0.40 | 0.50 | 0.10 | 20 |
| 14 | FIG. 5 | 90 | 0.4 | 0.10 | 0.40 | 0.30 | 0.30 | 0.60 | 0.10 | 15 |
| 15 | FIG. 5 | 90 | 0.4 | 0.15 | 0.50 | 0.25 | 0.25 | 0.80 | 0.20 | 20 |
| 16 | FIG. 5 | 90 | 0.4 | 0.20 | 0.70 | 0.15 | 0.15 | 0.80 | 0.20 | 85 |

TABLE 1-continued

| No. | Evaporation Source | Strength of Magnetic Field [G] | $N_2$ Partial Pressure [Pa] | $C_2H_2$ Partial Pressure [Pa] | C Amount (a) | N Amount (b) | M Amount (1 − a − b) | C—C Bonding Ratio (y) | Friction Coefficient (μ) | Wear Amount (μm²) |
|---|---|---|---|---|---|---|---|---|---|---|
| 17 | FIG. 5 | 90 | 0.4 | 0.40 | 0.80 | 0.10 | 0.10 | 0.90 | 0.30 | 85 |
| 18 | FIG. 5 | 90 | 0 | 0.20 | 1 | 0 | 0 | 0.90 | 0.50 | 90 |

Table 1 shows the following. Specifically, the cases of Nos. 1 and 11 are nitride films, and do not contain a specified amount of C. Accordingly, the friction coefficient considerably increases, and lubricity is low. Further, the cases of Nos. 2 to 4 are carbonitride films, but the C—C bonding ratio y thereof is zero, so that the friction coefficient has increased. The case of No. 5 is a carbonitride film and also has C—C bonds. However, the C—C bonding ratio y thereof is too low, so that the friction coefficient has increased. Further, in No. 5, the C amount a is excessive, so that the wear amount has also increased. The cases of Nos. 16 and 17 are carbonitride films, but the C amount a thereof is excessive, and the case of No. 18 is a carbide film, and thus, the wear amount thereof increases, resulting in inferior wear resistance.

In contrast, in Nos. 6 to 10 and 12 to 15, the C amount a and C—C bonding ratio y in the films are within the specified ranges, so that they show excellent sliding properties, that is, a friction coefficient of 0.30 or less and a wear amount of 50 μm² or less. Among these, in Nos. 7 to 10 and 13 to 15, the above-mentioned C amount a is 0.10 or more, so that the wear amount is as smaller as 45 μm² or less. In particular, in Nos. 8 to 10 and 13 to 15, the above-mentioned C amount a is 0.20 or more and a wear amount is further smaller as 40 μm² or less, which indicates that these films show more excellent sliding properties. Further, in the film having a higher C—C bonding ratio, although having the same C amount, that is, in No. 13 of Nos. 8 and 13 or No. 15 of Nos. 10 and 15, at least either the friction coefficient or the wear amount is smaller, which indicates that the film shows more excellent sliding properties. From these results, it can be found that the friction coefficient and the wear amount decrease in reverse proportion with increases in values of the C amount a and C—C bonding ratio y in the films within the specified ranges to enhance lubricity and wear resistance as the sliding properties of the films.

Further, it can be found that the film specified in the present invention can be formed by using the evaporation source 2 of FIG. 4 or the evaporation source 2B of FIG. 5, in which the magnetic field lines 13 sufficiently extend from the evaporation surface S of the target toward the substrate, as the form of evaporation source. It can be found that when the strength of the magnetic field is 70 gausses or more, the C amount equal to or more than the specified amount can be secured by adjusting the $C_2H_2$ partial pressure to 0.01 Pa or more. On the other hand, it can be found that when the strength of the magnetic field is 90 gausses, the C amount a exceeds the specified upper limit and is excessive to significantly increase the wear amount, with an increase in $C_2H_2$ partial pressure, as shown in No. 16 and No. 17. From these results, it can be found that when the strength of the magnetic field is 90 gausses, the $C_2H_2$ partial pressure is preferably 0.15 Pa or less. Further, for example, as the respective comparisons between No. 6 and No. 13, in both of which the $C_2H_2$ partial pressure is 0.05 Pa, and between No. 8 and No. 14, in both of which the $C_2H_2$ partial pressure is 0.10 Pa, it can be found that the C amount a and C—C bonding ratio y in the films are easily enhanced by using the evaporation source 2B in the form of FIG. 5, in which the magnetic field lines more extend from the evaporation surface of the target toward the substrate, even when the $C_2H_2$ partial pressure is the same.

Example 2

Using targets having various metal element compositions shown in Table 2, and using the arc evaporation source 2B in the form shown in FIG. 5, carbonitride films having the same metal element compositions as the above-mentioned targets were formed in the same manner as in Example 1, except that the $N_2$ partial pressure and the $C_2H_2$ partial pressure were constant as shown in Table 2. Then, the film composition (C, N) and the C—C bonding ratio y were determined, and evaluation of lubricity and wear resistance was performed, in the same manner as in Example 1. The results thereof are shown in Table 2.

TABLE 2

| No. | Target Composition (The numerical value is an atomic ratio to M) | $N_2$ Partial Pressure [Pa] | $C_2H_2$ Partial Pressure [Pa] | C Amount (a) | N Amount (b) | M Amount (1 − a − b) | C—C Bonding Ratio (Y) | Friction Coefficient (μ) | Wear Amount (μm²) |
|---|---|---|---|---|---|---|---|---|---|
| 1 | Ti0.50Al0.50 | 0.4 | 0.10 | 0.40 | 0.30 | 0.30 | 0.70 | 0.20 | 30 |
| 2 | Ti0.34Al0.66 | 0.4 | 0.10 | 0.45 | 0.25 | 0.30 | 0.60 | 0.20 | 25 |
| 3 | Al0.60Cr0.40 | 0.4 | 0.10 | 0.45 | 0.25 | 0.30 | 0.80 | 0.10 | 25 |
| 4 | Ti0.20Cr0.20Al0.60 | 0.4 | 0.10 | 0.43 | 0.25 | 0.32 | 0.65 | 0.17 | 20 |
| 5 | Cr | 0.4 | 0.10 | 0.40 | 0.30 | 0.30 | 0.59 | 0.20 | 30 |
| 6 | Ti0.20Cr0.20Al0.55Si0.05 | 0.4 | 0.10 | 0.50 | 0.20 | 0.30 | 0.60 | 0.15 | 15 |

From Table 2, it can be found that the films having excellent lubricity, that is, showing a low friction coefficient and also having excellent wear resistance, can be formed by forming the carbonitride films satisfying the C amount and C—C bonding ratio specified in the present invention, regardless of the composition of the targets to be used, that is, regardless of the kinds of metal elements constituting M as specified in the present invention.

DESCRIPTION OF REFERENCE NUMERALS AND SIGNS

1: Vacuum chamber
2, 2A, 2B: Arc evaporation source
3: Substrate table

4: Bias power supply
6: Target
7: Arc power supply
8: Permanent Magnet (magnetic field forming unit)
9: Electromagnet (magnetic field forming unit)
11: Exhaust port
12: Gas supply port
13: Magnetic field line
W: Substrate
S: Evaporation surface of target

The invention claimed is:

1. A hard film whose composition formula satisfies $M_{1-a-b}C_aN_b$, wherein the M is
   (i) at least one element selected from the group consisting of Ti, Cr and Al, or
   (ii) at least one element selected from the group consisting of Ti, Cr and Al, in combination with at least one element selected from the group consisting of a Group 4 element except for Ti, a Group 5 element, a Group 6 element except for Cr, Si, Y and a rare earth element, with the proviso that M is Ti and M is a combination of Ti and Cr are excluded,
   wherein atomic ratios of M, C and N satisfy
   $0.01 \leq a \leq 0.50$,
   $0.10 \leq b \leq 0.50$ and
   $0 < 1-a-b$, and
   a ratio y of C to C bonding to all C bonding in the film is 0.20 or more.

2. A method for manufacturing the hard film of claim 1, comprising performing arc discharge in an atmosphere gas comprising a hydrocarbon gas and a nitrogen gas by using an arc evaporation source which forms a magnetic field in which a magnetic field line extends in a direction of a substrate almost orthogonally to an evaporation surface of a target, thereby forming the hard film.

3. The method according to claim 2, wherein an evaporation source in which a magnetic field is formed in a manner that an angle formed by a normal line of an evaporation surface of the target and the magnetic field line is ±30° or less is used as the arc evaporation source.

4. The method according to claim 2, wherein an evaporation source in which a unit of forming the magnetic field is arranged between an evaporation surface of the target and the substrate is used as the arc evaporation source.

5. The method according to claim 2, wherein the magnetic field is formed in a manner that a strength of the strongest magnetic field on an evaporation surface of the target is 20 gausses or more.

6. The hard film according to claim 1, wherein the M is (i) at least one element selected from the group consisting of Cr and Al.

7. The hard film according to claim 1, wherein the M is (ii) at least one element selected from the group consisting of Ti, Cr and Al, in combination with at least one element selected from the group consisting of a Group 4 element except for Ti, a Group 5 element, a Group 6 element except for Cr, Si, Y and a rare earth element, and the combination of Ti and Cr is excluded.

8. The hard film according to claim 1, wherein the M comprises Cr.

9. The hard film according to claim 1, wherein the M comprises Al.

10. The hard film according to claim 1, wherein the ratio y of C to C bonding to all C bonding in the film is 0.30 or more.

11. The hard film according to claim 1, wherein the ratio y of C to C bonding to all C bonding in the film is 0.40 or more.

12. The hard film according to claim 10, wherein the ratio y of C to C bonding to all C bonding in the film is 0.30 to 0.95.

13. The hard film according to claim 10, wherein the ratio y of C to C bonding to all C bonding in the film is 0.40 to 0.90.

* * * * *